US006741375B2

(12) United States Patent
Kimura

(10) Patent No.: US 6,741,375 B2
(45) Date of Patent: May 25, 2004

(54) OPTICAL MODULATOR DRIVE CIRCUIT

(75) Inventor: Madoka Kimura, Miyagi (JP)

(73) Assignee: NEC Communication Systems, Ltd., Tokyo (JP)

( * ) Notice: Subject to any disclaimer, the term of this patent is extended or adjusted under 35 U.S.C. 154(b) by 19 days.

(21) Appl. No.: 10/192,729

(22) Filed: Jul. 11, 2002

(65) Prior Publication Data
US 2003/0011865 A1 Jan. 16, 2003

(30) Foreign Application Priority Data
Jul. 12, 2001 (JP) ........................ 2001-211787

(51) Int. Cl.[7] .............. G02F 1/00; H01S 3/13
(52) U.S. Cl. ............. 359/237; 359/238; 372/29.01
(58) Field of Search ............... 359/237, 238; 372/29.01, 29.014, 29.15, 38.03, 29.015; 385/14

(56) References Cited

U.S. PATENT DOCUMENTS 5,377,213 A * 12/1994 Honda .................. 372/38
6,278,539 B1 * 8/2001 Ooi et al. ............. 359/237
2002/0061035 A1 * 5/2002 Tokita et al. .......... 372/26

FOREIGN PATENT DOCUMENTS

JP          3-73917          3/1991

* cited by examiner

Primary Examiner—Scott J. Sugarman
Assistant Examiner—M. Hasan
(74) Attorney, Agent, or Firm—McGinn & Gibb, PLLC

(57) ABSTRACT

A voltage clamp transistor 12 has a main current path (i.e., drain-source path or emitter-collector path) serially connected to the output terminal 9 of a drive IC 1, and also has a control electrode (i.e., gate or source) with a predetermined voltage applied thereto. An optical modulator 10 of a laser diode or the like is connected either directly or via an AC-coupled capacitor to the output side of the transistor 12.

20 Claims, 5 Drawing Sheets

US 6,741,375 B2

OPTICAL MODULATOR DRIVE CIRCUIT

BACKGROUND OF THE INVENTION

This application claims benefit of Japanese Patent Application No. 2001-211787 filed on Jul. 12, 2001, the contents of which are incorporated by the reference.

The present invention relates to optical modulator drive circuits and, more particularly, to optical modulator drive circuits for driving optical modulator such as laser diodes.

A laser beam emitted from a laser diode is used for such purposes as modulation of optical signal in optical fiber communication and reading of signal from a CD (Compact Disc) and DVD (Digital Versatile Disc). A laser diode drive circuit is used for generating a desired fixed laser beam for such a laser diode.

Prior art examples of such laser diode drive circuit is disclosed in, for instance, a Japanese Patent Laid-Open No. 3-73917 entitled "Optical Modulator Drive Circuit". FIG. 4 shows a typical laser diode drive circuit or modulation circuit. Referring to FIG. 4, a laser diode 110 is serially connected between an output terminal 106 of a semiconductor integrated circuit (i.e., drive IC) 100 and a power supply 121. The drive IC 100 comprises a pair of differentially connected transistors 101 and 102 and a current source 103 connected to the common connection emitter of these transistors 101 and 102.

A modulation signal or like drive input signal is inputted (i.e., applied) between input terminal 104 and 105 connected to the bases of the differential transistors 101 and 102 in the drive IC 100. The collector of the transistor 101 is connected to a power source 122, and the collector of the transistor 102 is connected via the output terminal 106 and the laser diode 110 to the power source 121. The current source 103 has its other terminal connected to a power source 123.

In the modulation circuit or laser diode drive circuit as shown in FIG. 4, by a modulation signal or a drive signal inputted between the input terminals 104 and 106 of the drive IC, the current in the current source 103 is distributed to the collectors of the transistors 101 to 102 for the control of the drive current in the laser diode 110, which is connected to the output terminal 106 as the collector of the transistor 102. Based on the drive current, the laser diode 110 outputs a modulated optical signal.

FIG. 5 shows an optical modulator drive circuit as another prior art example of the laser diode drive circuit. In the optical modulator drive circuit, a load 230 which is constituted by a resistor or an inductor, is connected between the output terminal 206 of the drive IC 200 including a MOS transistor 201 and a power source 221. An optical modulator 210 including a laser diode is connected via an AC coupled capacitor 231 between the output terminal 206 and the power source 222. An input terminal 204 is connected to the gate of transistor 201, which has its source connected to a power source 223 and the drain connected to the output terminal 206 noted above.

The drain current is changed according to a modulation signal inputted to the gate input terminal 204 of the transistor 201 constituting the drive IC 200. The modulation signal which is based on change in the output voltage from the output terminal 206 flows through the AC-coupling capacitor 231 in the optical modulator 210.

In the semiconductor integrated circuit, however, the breakdown voltage is reduced with increasing operation speed. On the other hand, a high voltage is necessary for driving the laser diode. Therefore, the output voltage of the drive IC of such optical modulator may exceed the breakdown voltage of the drive IC and cause rupture of the IC.

SUMMARY OF THE INVENTION

The present invention has been made in view of the above prior art, and its object is to provide an optical modulator drive circuit with a low voltage as the output voltage of the driver IC.

According to an aspect of the present invention, there is provided an optical modulator drive circuit for driving an optical modulator by applying a drive signal from a drive output of the optical modulator drive circuit to the optical modulator, wherein a voltage clamp circuit is provided between the drive output and the optical modulator to clamp the voltage at the drive output to be lower than the breakdown voltage of the drive circuit.

According to another aspect of the present invention, there is provided an optical modulator drive circuit for driving an optical modulator by applying a drive signal from a drive output of the optical modulator drive circuit to the optical modulator, wherein a voltage clamp circuit is provided between the drive output and a load connected to a power supply to clamp the voltage at the drive output to be lower than the breakdown voltage of the drive circuit and the optical modulator is connected through a coupling capacitor to the drive circuit.

The voltage clamp circuit includes a transistor with a main current path thereof connected to the output terminal of the drive IC, a constant voltage being applied to a control terminal of the transistor. The voltage clamp circuit includes a uni-polar transistor with a main current path thereof connected to the output terminal of the drive IC, a constant voltage being applied to a control terminal of the transistor. The drive IC includes a pair of differentially connected transistors and a current source connected to the pair transistors. The drive IC is constituted by a single MOS transistor. The drive IC includes a MOS transistor and a current source connected in parallel with the transistor. The load is a resistor or an inductor. The drive circuit is semiconductor integrated circuit.

Other objects and features will be clarified from the following description with reference to attached drawings.

PREFERRED EMBODIMENTS OF THE INVENTION

Preferred embodiments of the present invention will now be described with reference to the drawings.

Figure 1:
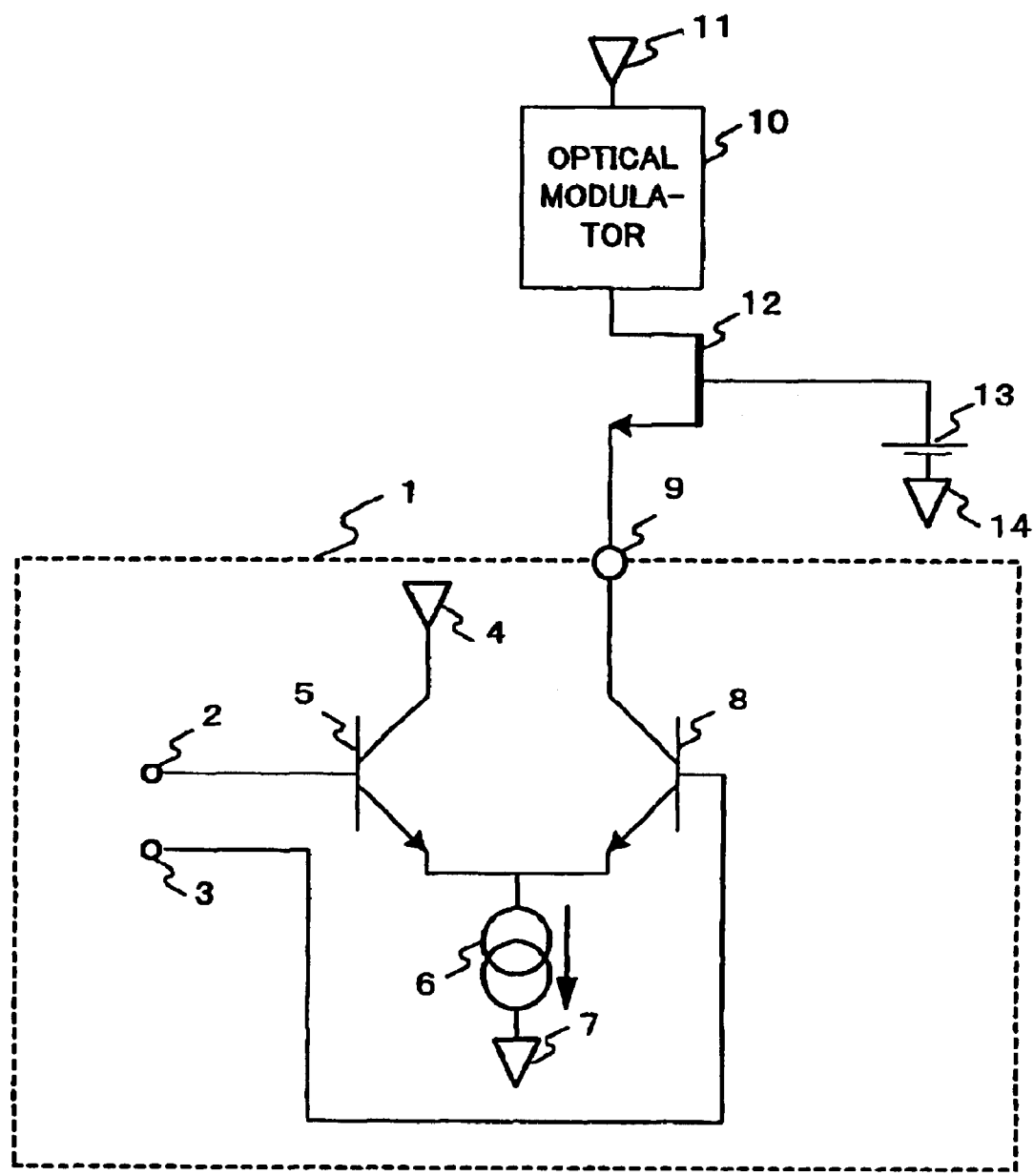
FIG. 1 is a view showing the construction of a first embodiment of the optical modulator drive circuit according to the present invention.

FIG. 1 is a view showing the construction of a first embodiment of the optical modulator drive circuit according to the present invention. This optical modulator drive circuit comprises a semiconductor integrated circuit (i.e., drive IC) 1, a voltage clamp circuit, which clamps the voltage at the output terminal 9 of the drive IC as will be described later, and an optical modulator (or a laser diode) 10 connected between the output terminal of the clamp circuit and a power source 11.

Figure 4:
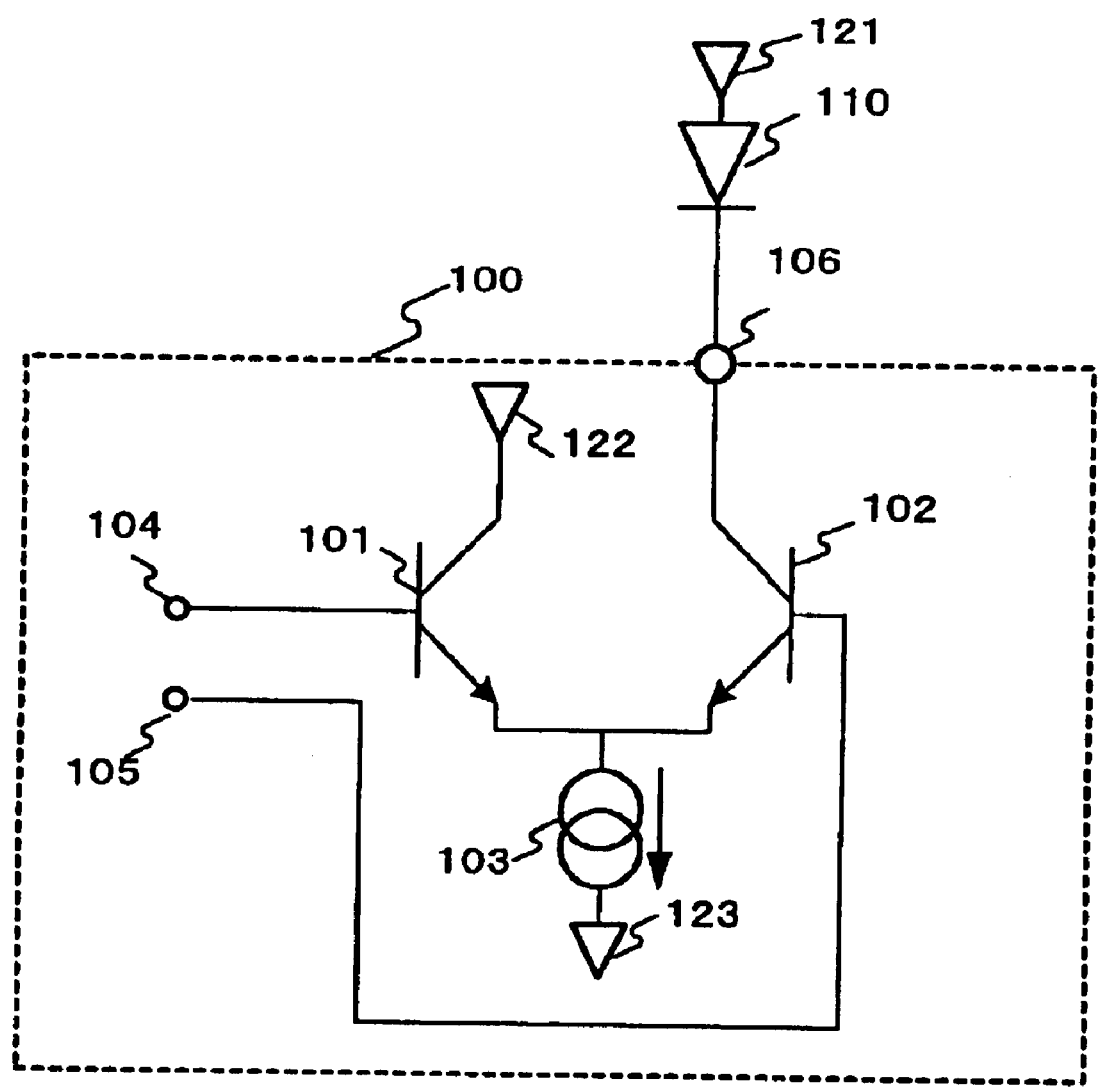
FIG. 4 shows a typical laser diode drive circuit or modulation circuit.
Figure 5:
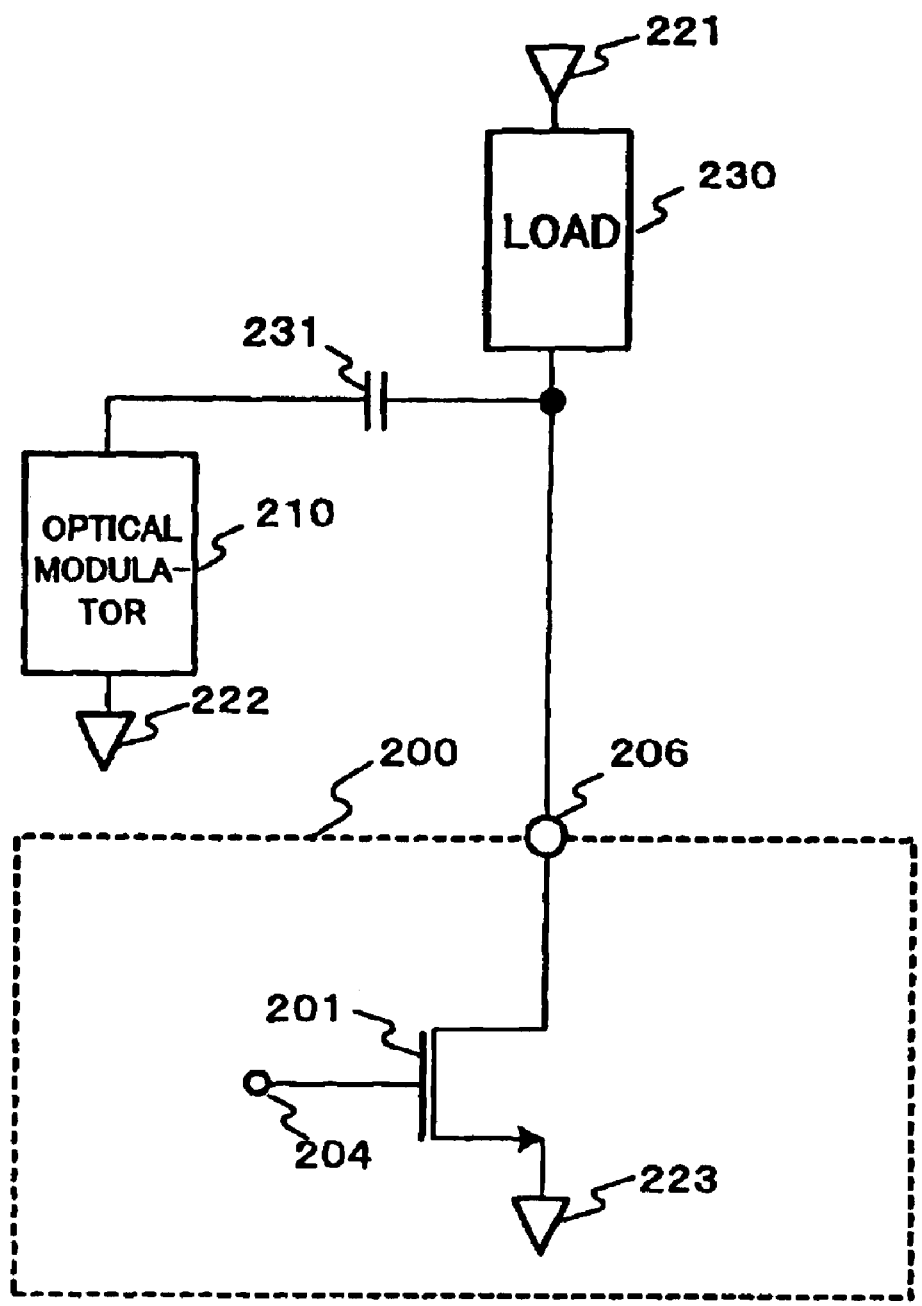
FIG. 5 shows an optical modulator drive circuit as another prior art example of the laser diode drive circuit.

The drive IC 1, like the IC shown in FIG. 4 as described above, comprises a pair of differentially connected transistors 5 and 8 and a current source 6 connected between the common emitter of the transistors 5 and 8 and the power source 7. The collector of the transistor 5 is connected to the power source 4, and the collector of the transistor 8 is connected to the output terminal 9. The transistors 5 and 8 have their bases connected to input terminals 2 and 3, between which a modulation signal is inputted.

The voltage clamp circuit includes a transistor (which may be a uni-polar transistor or an FET (field-effect transistor) 12, and a voltage source 13 connected between the gate of the transistor 12 as control electrode thereof and a power source 14. The transistor 12 has its source connected to the collector of the transistor 8 as the output terminal of the drive IC and its drain connected via an optical modulator 10 to the power supply 11. The transistor 12 has its main current path (i.e., source-drain path) serially connected to the output terminal 9.

As has been described, in the optical modulator drive circuit according to the present invention the transistor 12 as the voltage clamp circuit or high breakdown voltage circuit is connected between the drive IC 1 and the optical modulator 10. With this construction, the breakdown voltage at the output terminal 9 of the drive IC 1 is held to be lower than the breakdown voltage of the drive IC by the gate voltage of the transistor 12 or the voltage of the power source 14 and the voltage source 13 applied to the gate. It is thus possible to eliminate the possibility of rupture of the drive IC 1. The modulation signal applied between the input terminals 2 and 3 is subjected to voltage-to-current conversion in the differential transistors 5 ad 8 and then fed via the transistor 12 to the optical modulator 10 for current driving thereof to generate a desired optical signal. With the voltage clamp transistor 12 having high breakdown voltage connected between the low breakdown voltage drive IC 1 and the optical modulator 10 in the above way, it is possible to obtain an optical modulation drive circuit for driving the optical modulator 10 by using the low breakdown voltage drive IC 1.

Figure 2:
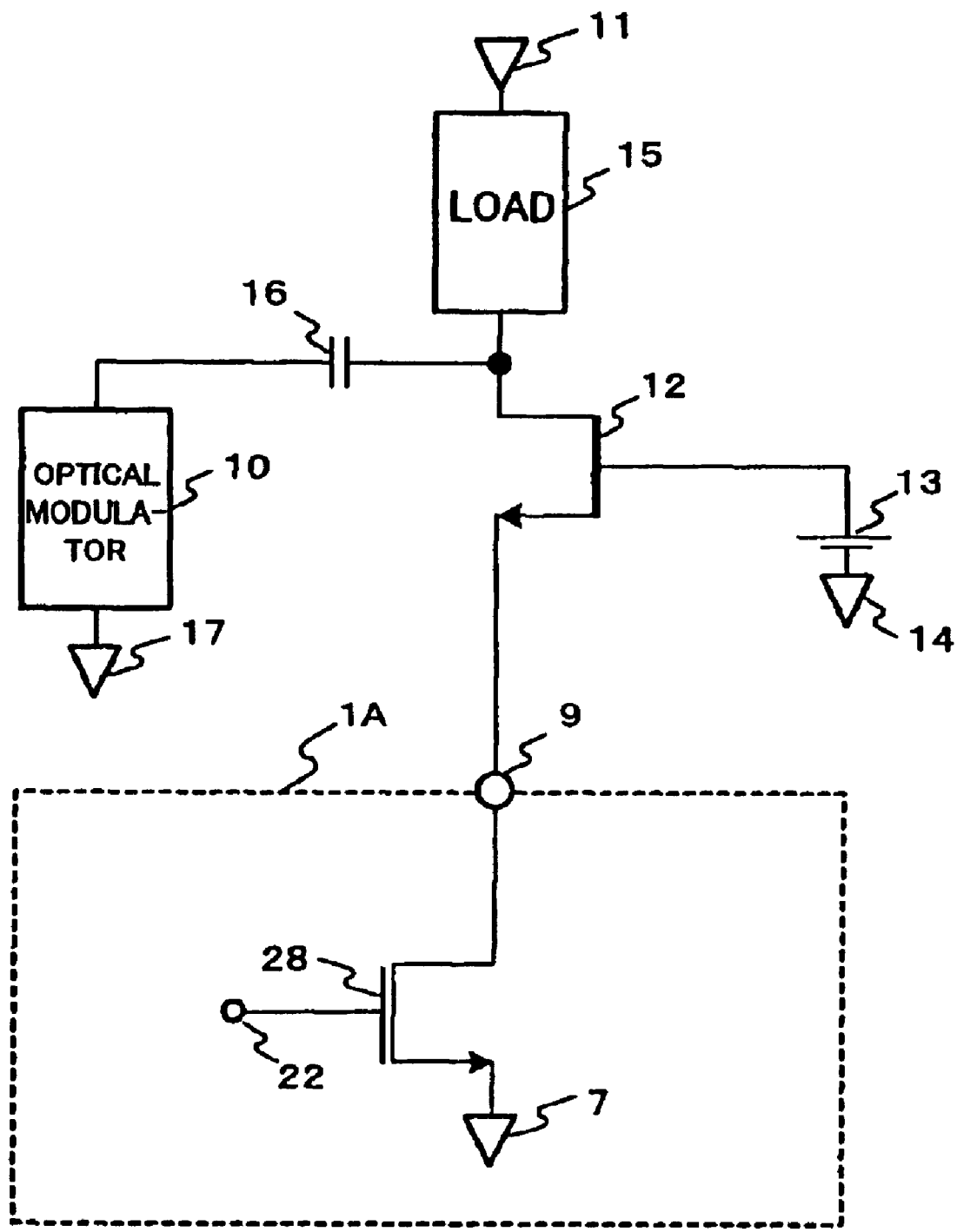
FIG. 2 shows a circuit diagram of a second embodiment of the optical modulator drive circuit according to the present invention.

FIG. 2 shows a circuit diagram of a second embodiment of the optical modulator drive circuit according to the present invention. In the Figure, constituent elements like those in the first embodiment shown in FIG. 1 are designated by like reference numerals. The optical modulator drive circuit comprises a drive IC 1A, a voltage clamp transistor 12 connected to the output terminal 9 of the drive IC 1A, a load resistor or inductor 15 connected to the output terminal (i.e., drain) of the transistor 12, a power source 11, a coupling capacitor 16 connected in series between the output terminal of the transistor 12 and a power source 17 and an optical modulator 10. A voltage source 13 is connected between the control terminal (i.e., gate) of the transistor 12 and a power source 14.

The drive IC 1A has its gate connected to an input terminal 22, its source connected to a power source 7 and a drain connected to the output terminal 9. A modulation signal is inputted to (i.e., applied to) the input terminal 22.

The operation of a second embodiment of the optical modulation drive circuit as shown in FIG. 2 according to the present invention will now be described. A modulation signal applied to the input terminal 22 of the drive IC 1 cause the output current of the output terminal 9 to flow from the power source 11 through the main current path (i.e., drain-source path) of the transistor 12 and the resistor or inductor 15. Changes in the output voltage from the transistor 12 cause changes in the current flowing through the optical modulator 10 for output light modulation. The voltage at the output terminal 9 of the drive IC 1A is determined by the control electrode (i.e., gate) of the transistor 12 and does not exceed the breakdown voltage of the drive IC 1A, thus preventing breakdown voltage rupture thereof.

A third embodiment of the optical modulator drive circuit according to the present invention will now be described with reference to FIG. 3. This optical modulator drive circuit comprises a drive IC 1B, a voltage clamp transistor 12 connected to the output terminal of the drive IC 1B, a resistor or inductor 15 connected between the output terminal of the transistor 12 and the power source 11, and an AC-coupling capacitor 16 connected in series between the output terminal (i.e., drain) of the transistor 12 and the power source 17 and an optical modulator 10.

The drive IC 1B comprises a MOS transistor 28 and a current source 26. The transistor 28 has its gate serving as an input terminal 22 of a modulation signal, its source connected to the power source 7 and its drain connected to the output terminal 9. A current source 26 is connected between the output terminal 9 and the power source 29. In other words, the transistor 28 and the output terminal 9 are connected in parallel to the output terminal 9.

Figure 3:
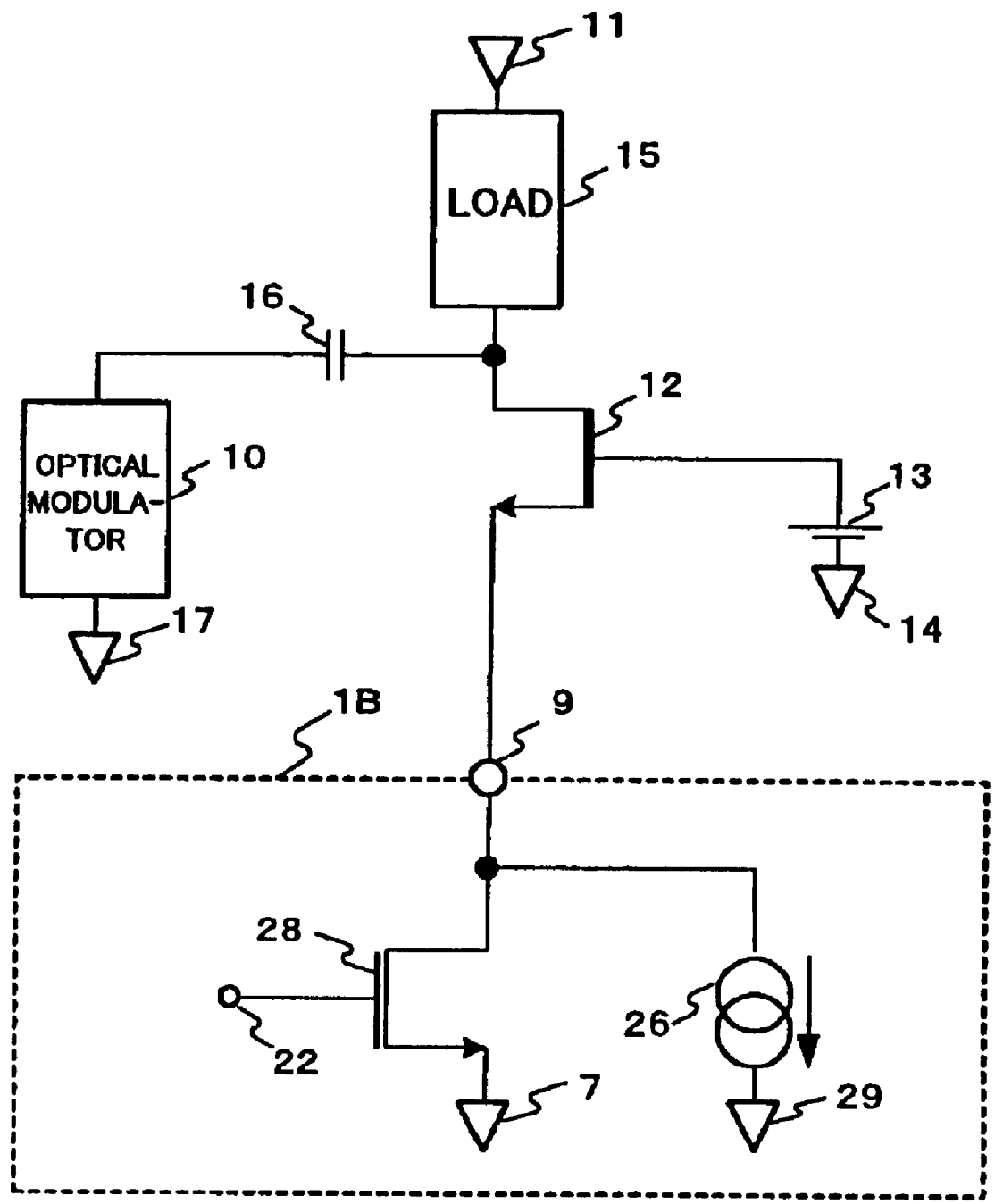
FIG. 3 shows a circuit diagram of a third embodiment of the optical modulator drive circuit according to the present invention.

The optical modulator drive circuit shown in FIG. 3 operates substantially in the same manner as the optical modulator drive circuit shown in FIG. 2. The current source 26 has a function of stabilizing the bias on the transistor 28 and the voltage on the output terminal 9. The bias current source 26 may be provided outside the drive IC 1B.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

As has been understood from the following, with the optical modulator drive circuit according to the present invention the following practically pronounced effect is obtainable. Since the voltage clamp circuit or a breakdown voltage rupture prevention circuit is provided at the output terminal 9 of the drive IC 1, it is possible to effectively prevent breakdown voltage rupture from occurring due to surpassing of the breakdown voltage of the drive IC by the voltage at the output terminal 9. Also, the circuit can be realized easily and inexpensively since it is obtained by merely connecting the main current path of a uni- or a bi-polar transistor and adapting such that a predetermined constant voltage is applied to the control electrode (i.e., gate or base) of the transistor. Furthermore, it is possible to realize ready remodeling of existing optical modulator drive circuits.

What is claimed is:

1. An optical modulator drive circuit for driving an optical modulator by applying a drive signal from a drive output of the optical modulator drive circuit to the optical modulator, wherein a voltage clamp circuit is provided between the drive output and the optical modulator to clamp the voltage at the drive output to be lower than the breakdown voltage of the drive circuit.

2. An optical modulator drive circuit for driving an optical modulator by applying a drive signal from a drive output of the optical modulator drive circuit to the optical modulator, wherein a voltage clamp circuit is provided between the drive output and a load connected to a power supply to clamp the voltage at the drive output to be lower than the breakdown voltage of the drive circuit and the optical modulator is connected through a coupling capacitor to the drive circuit.

3. The optical modulator drive circuit according to claim 1, wherein the voltage clamp circuit includes a transistor with a main current path thereof connected to the output terminal of the drive IC, a constant voltage being applied to a control terminal of the transistor.

4. The optical modulator drive circuit according to claim 1, wherein the voltage clamp circuit includes a uni-polar transistor with a main current path thereof connected to the output terminal of the drive IC, a constant voltage being applied to a control terminal of the transistor.

5. The optical modulator drive circuit according to claim 1, wherein the drive IC includes a pair of differentially connected transistors and a current source connected to the pair transistors.

6. The optical modulator drive circuit according to claim 1, wherein the drive IC includes by a single MOS transistor.

7. The optical modulator drive circuit according to claim 1, wherein the drive IC includes a MOS transistor and a current source connected in parallel with the transistor.

8. The optical modulator drive circuit according to claim 2, wherein the load is a resistor or an inductor.

9. The optical modulator drive circuit according to claim 1, wherein the drive circuit comprises a semiconductor integrated circuit.

10. The optical modulator drive circuit according to claim 2, wherein the voltage clamp circuit includes a transistor with a main current path thereof connected to the output terminal of the drive IC, a constant voltage being applied to a control terminal of the transistor.

11. The optical modulator drive circuit according to claim 2, wherein the voltage clamp circuit includes a uni-polar transistor with a main current path thereof connected to the output terminal of the drive IC, a constant voltage being applied to a control terminal of the transistor.

12. The optical modulator drive circuit according to claim 2, wherein the drive IC includes a pair of differentially connected transistors and a current source connected to the pair transistors.

13. The optical modulator drive circuit according to claim 2, wherein the drive IC includes by a single MOS transistor.

14. The optical modulator drive circuit according to claim 2, wherein the drive IC includes a MOS transistor and a current source connected in parallel with the transistor.

15. The optical modulator drive circuit according to claim 2, wherein the drive circuit comprises a semiconductor integrated circuit.

16. A modulator circuit comprising:

a drive circuit that provides a modulated drive signal to an output; and a voltage clamp connected to the output that clamps the voltage at the output to a voltage that is lower than a breakdown voltage of the drive circuit.

17. The circuit of claim 16, wherein the drive circuit comprises a pair of differentially connected transistors having a first threshold voltage and wherein the voltage clamp comprises a transistor having second threshold voltage that is higher than the first threshold voltage.

18. The circuit of claim 17, wherein the voltage clamp comprises a voltage source connected to the gate of the transistor and wherein the transistor includes a source connected to the output.

19. The circuit of claim 16, wherein the drive circuit comprises a MOS transistor having a gate connected to an input and a drain connected to the output and wherein the MOS transistor has a first threshold voltage and wherein the voltage clamp comprises a transistor having a second threshold voltage that is higher than the first threshold voltage.

20. The circuit of claim 19, wherein the drive circuit further comprises a current source connected to the output.

* * * * *